(12) United States Patent
Parent et al.

(10) Patent No.: US 6,894,105 B2
(45) Date of Patent: May 17, 2005

(54) DYED FLUOROPOLYMERS

(75) Inventors: Michael J. Parent, Oakdale, MN (US); Patricia M. Savu, Maplewood, MN (US); Harry E. Johnson, Hudson, WI (US); David B. Olson, Marine on Saint Croix, MN (US)

(73) Assignee: 3M Innovatives Properties Company, St. Paul, MN (US)

( * ) Notice: Subject to any disclaimer, the term of this patent is extended or adjusted under 35 U.S.C. 154(b) by 192 days.

(21) Appl. No.: 10/205,764

(22) Filed: Jul. 26, 2002

(65) Prior Publication Data

US 2004/0024100 A1 Feb. 5, 2004

(51) Int. Cl.⁷ .......................... C08L 27/12; B32B 27/00
(52) U.S. Cl. ................... 524/520; 524/544; 428/421; 428/422; 526/256; 526/259
(58) Field of Search .................. 428/421, 422; 524/520, 544; 526/256, 259

(56) References Cited

U.S. PATENT DOCUMENTS

| | | | |
|---|---|---|---|
| 2,803,615 A | 8/1957 | Ahlbrecht et al. | |
| 2,841,573 A | 7/1958 | Ahlbrecht et al. | |
| 4,036,859 A | 7/1977 | Ribaldone et al. | |
| 4,698,240 A | 10/1987 | Ono et al. | |
| 4,795,794 A | * 1/1989 | Winnik et al. | 526/259 |
| 5,151,516 A | 9/1992 | Beck et al. | |
| 5,415,669 A | 5/1995 | Bühler et al. | |
| 5,847,091 A | * 12/1998 | Shiraki et al. | 534/838 |
| 5,847,156 A | 12/1998 | Eldin et al. | |
| 6,001,936 A | 12/1999 | Barrera et al. | |
| 6,391,807 B1 | 5/2002 | Jariwala et al. | |
| 6,448,301 B1 | 9/2002 | Gaddam et al. | |
| 2002/0042470 A1 | 4/2002 | Moore et al. | |

FOREIGN PATENT DOCUMENTS

| | | |
|---|---|---|
| EP | 0 004 655 A2 | 10/1979 |
| EP | 0 323 060 A2 | 7/1989 |
| EP | 0 422 535 A1 | 4/1991 |
| EP | 0 554 696 A2 | 8/1993 |
| EP | 1 172 418 A2 | 1/2002 |
| GB | 1 270 254 | 4/1972 |
| WO | WO 90/01526 | 2/1990 |
| WO | WO 99/21937 | 5/1999 |
| WO | WO 01/23472 A1 | 4/2001 |
| WO | WO 02/16306 A2 | 2/2002 |
| WO | WO 02/16517 A2 | 2/2002 |
| WO | WO 02/20625 A1 | 3/2002 |
| WO | WO 02/066483 A1 | 8/2002 |

\* cited by examiner

Primary Examiner—Kriellion A. Sanders
(74) Attorney, Agent, or Firm—Lisa P. Fulton

(57) ABSTRACT

Dyed fluoropolymers that are useful, for example, as conformal coatings comprise the reaction product of one or more fluorochemical (meth)acrylate monomers and one or more (meth)acrylate functional dyes. Coating compositions comprise the dyed fluoropolymer and articles are coated with the coating composition.

23 Claims, 1 Drawing Sheet

DYED FLUOROPOLYMERS

FIELD

This invention relates to dyed fluoropolymers that are useful, for example, as conformal coatings for electronic components and, in other aspects, to coating compositions comprising the dyed fluoropolymers, and articles coated with the coating compositions.

BACKGROUND

Conformal coatings are protective coatings that conform to the surface of a substrate or article (for example, dielectric coatings on electronic components and circuit board assemblies). Properly applied conformal coatings can increase the working life of a circuit board assembly by protecting its components and the board itself. Conformal coatings can, for example, provide a barrier to moisture, chemicals, dust, fungus, ultraviolet light, and ozone, as well as act as a stress-relieving shock and vibration absorber.

Various materials such as, for example, polyurethanes, acrylics, epoxies, and silicones are commonly used for conformal coatings. The selection of a conformal coating material is generally based upon desired performance and processing requirements for a specific application. Silicones, for example, are known for high temperature operating capability and can typically be used at operating temperatures up to about 200° C., whereas many other conformal coating materials can typically only be used at operating temperatures up to about 130° C. Silicones, however, exhibit a high coefficient of thermal expansion and relatively poor adhesion to many materials. Acrylics, on the other hand, are generally the easiest of the coating materials to handle and rework, and typically provide better adhesion properties than silicone. Acrylics, however, often suffer from the temperature limitations mentioned above.

Another consideration in the selection of a conformal coating material is the cure mechanism required by the material. Depending upon the type of material, the conformal coating may be a heat cure, ultraviolet (UV) light cure, moisture cure, or no cure system. The substrate or article being coated must be capable of withstanding the cure mechanism required by the material. Therefore, conformal coating materials that require no cure mechanism are typically most desirable.

Proper coverage and uniformity of the conformal coating over the assembly is critical for effective protection of the assembly. It can sometimes be difficult, however, to determine the integrity and uniformity of the conformal coating when it is coated on an assembly. Therefore, the conformal coating material is sometimes doped with a dye or "tracer" to aid in the quality assurance inspection of the assembly for proper coverage. Fluorescent tracers work well in many conformal coating materials, but the use of fluorescent dyes in fluoropolymers is limited because of poor compatibility of the dyes with the polymer matrix. This results in poor color quality and dye bleed and little or no color entrainment into the resulting coating.

SUMMARY

In view of the foregoing, we recognize that there is a need for compositions that are suitable for use in conformal coatings used in high temperature applications and that contain an effective tracer. Furthermore, we recognize that it would be advantageous for coating compositions that require no curing to form a conformal coating.

Briefly, in one aspect, the present invention provides dyed fluoropolymers that are useful as conformal coating materials. As used herein, a "dyed fluoropolymer" refers to a fluoropolymer comprising a dye that is covalently bonded to the polymer and excludes fluoropolymers in which a dye has merely been dissolved or blended therein. Dyed fluoropolymers of the invention comprise the reaction product of one or more fluorochemical (meth)acrylate monomers and one or more olefinic functional dyes (preferably, one or more (meth)acrylate functional dyes). As used herein, "(meth) acrylate" refers to both acrylates and methacrylates.

It has been discovered that when used in a conformal coating the above-described dyed fluoropolymers surprisingly meet the thickness, flexibility, and dielectric withstand requirements of the IPC specification for conformal coatings, IPC-CC-830 "Qualification and Performance of Electronic Insulating Compound for Printed Board Assemblies."

The dyed fluoropolymers of the invention are also highly resistant to leaching or blooming of the meth(acrylate) functional dye because the dye is covalently bonded to the fluorochemical (meth)acrylate monomers. In addition, the dyed fluoropolymers of the invention are more thermally stable than most conformal coating materials, being only slightly less stable than silicone. Yet since they are acrylic, the dyed fluoropolymers of the invention have appreciably better adhesion than silicone to many materials. Furthermore, the dyed fluoropolymers of the invention do not require a cure mechanism.

Thus, the dyed fluoropolymers of the invention meet the need in the art for conformal coating materials that can be used in high temperature applications and contain an effective fluorescent tracer.

In other aspects, this invention also provides coating compositions comprising the dyed fluoropolymers of the invention and articles such as, for example, circuit board assemblies coated with the coating compositions.

DETAILED DESCRIPTION OF ILLUSTRATIVE EMBODIMENTS

Figure 1:
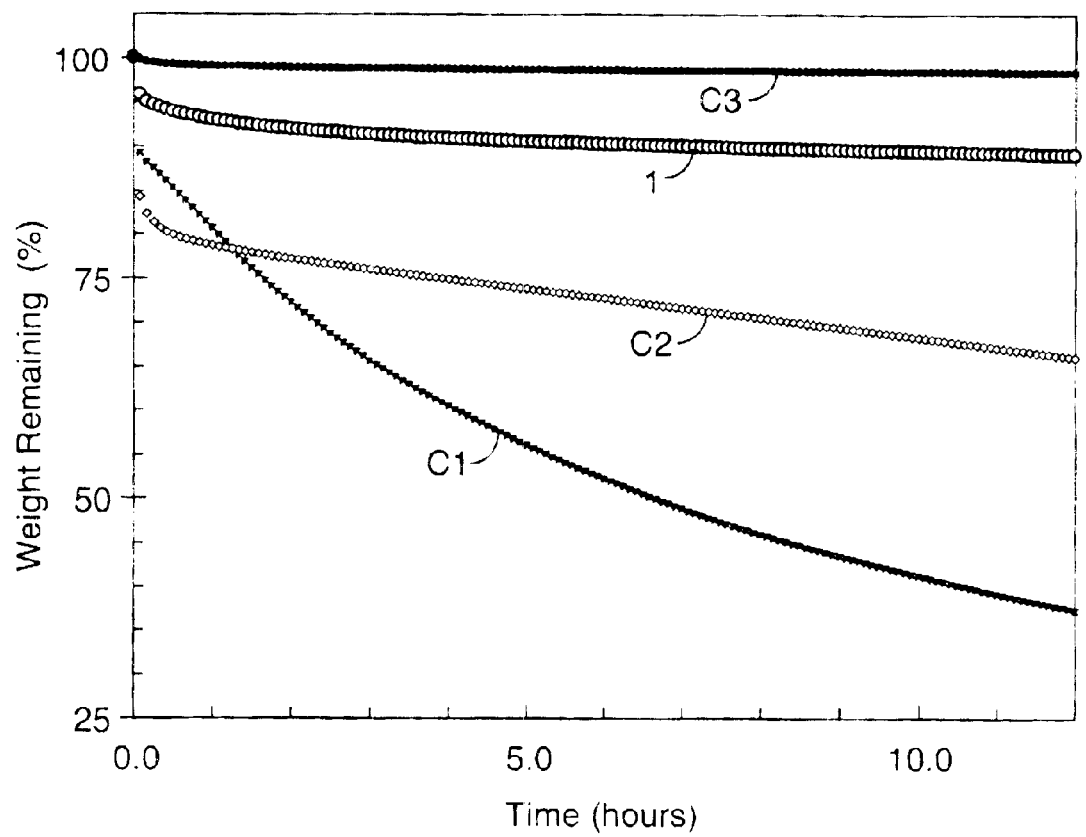
FIG. 1 is a plot of weight percent remaining versus time for a series of coating compositions described in Comparative Examples C1–C3 and Example 1.

The dyed fluoropolymers of the invention comprise one or more fluorochemical (meth)acrylate monomers. Suitable fluorochemical (meth)acrylate monomers include, for example, 1,1-dihydroperfluorobutyl (meth)acrylate, 1,1-dihydropentafluoropropyl (meth)acrylate, hexafluoroisopropyl (meth)acrylate, 2,2,3,3,4,4,4-heptafluorobutyl (meth) acrylate, 2,2,3,4,4,4-hexafluorobutyl (meth)acrylate, 2,2,3, 3-tetrafluoropropyl (meth)acrylate, 1,1-dihydroperfluorocyclohexylmethyl (meth)acrylate, 1-pentafluoroethyl-2-(trifluoromethyl)propyl (meth) acrylate, 3,3,4,4,5,5,6,6,7,7,8,8,9,9,10,10,10-heptadecafluorodecyl (meth)acrylate, 3,3,4,4,5,5,6,6,7,7,8, 8,8-tridecafluorooctyl (meth)acrylate, N-methyl perfluorooctanesulfonamidoethyl (meth)acrylate, N-ethyl perfluorohexylsulfonamidoethyl (meth)acrylate, and N-methyl perfluorobutanesulfonamidoethyl (meth)acrylate.

Preferably the (meth)acrylate is derived from an alcohol selected from $CF_3CHFCF_2CH_2OH$, $HCF_2CF_2CH_2OH$, $C_2F_5CH(OH)CF(CF_3)_2$, $C_3F_7CH_2OH$, $C_4F_9CH_2OH$, $C_4F_9SO_2N(CH_3)CH_2CH_2OH$, and alcohols derived from the telomerization of tetrafluoroethylene. Preferred fluorochemical (meth)acrylate monomers are N-methyl perfluorobutanesulfonamidoethyl acrylate and N-methyl perfluorobutanesulfonamidoethyl methacrylate. Preferably, at least 75 percent of the fluoromonomers used in the fluoropolymers of the invention are N-methyl perfluorobutanesulfonamidoethyl acrylate.

The dyed fluoropolymers of the invention include those that can be represented by the following general formula:

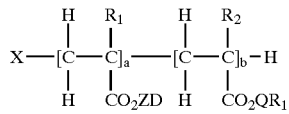

wherein the sum of a+b is a number such that the compound is polymeric (a and b can represent non-integral values or averages of the number of each monomer unit present), $R_1$ is hydrogen or methyl, $R_2$ is a straight chain or branched chain alkyl containing 1 to about 4 carbon atoms, z is an organic divalent linking group, D is a dye moiety (that is, a moiety comprising a chromophore that absorbs and/or emits light in the visible region), Q is a covalent bond or a divalent linking group, $R_f$ is a fluoroaliphatic group that comprises a fully fluorinated terminal group having 12 carbon atoms or less, and X is a hydrogen atom or a group derived from a free radical initiator.

The dyed fluoropolymer of the invention contains a plurality of pendant $R_f$ groups (typically from 2 to about 10) proximal to one another and preferably contains from about 5 percent to about 80 percent, more preferably from about 20 percent to about 65 percent, and most preferably about 25 percent to about 55 percent fluorine by weight, based on the total weight of the compound, the loci of the fluorine being essentially in the $R_f$ groups. $R_f$ is a stable, inert, non-polar, preferably saturated, monovalent moiety which is both oleophobic and hydrophobic. $R_f$ preferably contains at least about 3 carbon atoms, more preferably about 3 to about 6 carbon atoms, and most preferably about 3 or 4 carbon atoms. $R_f$ can be a straight chain or branched chain or can be cyclic if sufficiently large. $R_f$ is preferably free of polymerizable olefinic unsaturation. It is preferred that $R_f$ contain about 35% to about 78% fluorine by weight, more preferably about 40% to about 78% fluorine by weight. The terminal portion of the $R_f$ group contains a fully fluorinated terminal group such as, for example, —$CF_3$, or can be partially fluorinated such as, for example, $HCF_2$—.

Z and Q are independently chosen linking groups that can be a divalent alkylene (straight chain or branched chain) containing 1 to about 15 carbon atoms. The alkylene can optionally contain one or more catenary heteroatom-containing groups. As used herein, the term "heteroatom-containing group" means a group containing a heteroato (for example, nitrogen, oxygen, or sulfur) that replaces one or more carbon atoms of the Z or Q linking group in a manner such that the heteroatom-containing group is bonded to at least two carbon atoms of the Z or Q linking group.

The Z or Q linking group can be a group that results from the condensation reaction of a nucleophile such as an alcohol, an amine, or a thiol with and electrophile, such as an ester, acid, acid halide, isocyanate, sulfonyl halide, sulfonyl ester, or can result from a displacement reaction between a nucleophile and leaving group.

Illustrative examples of suitable Z and Q linking groups include straight chain, branched chain, or cyclic aklyenes, arylenes, and aralkylenes that optionally contain, for example, an oxy, oxo, hydroxy, thio, sulfonyl, sulfoxy, amino, imino, sulfonamido, carboxamido, carbonyloxy, urethaneylene, urylene, or a combination thereof (for example, sulfonamidoalkylene).

Representative examples of suitable Z and Q linking groups include the following:

| | |
|---|---|
| —$SO_2NR_1'(CH_2)_kO(O)C$— | —$CONR_1'(CH_2)_kO(O)C$— |
| —$(CH_2)_kO(O)C$— | —$CH_2CH(OR_2')CH_2O(O)C$— |
| —$(CH_2)_kC(O)O$— | —$(CH_2)_kSC(O)$— |
| —$(CH_2)_kO(CH_2)_kO(O)C$— | —$(CH_2)_kS(CH_2)_kO(O)C$— |
| —$(CH_2)_kSO_2(CH_2)_kO(O)C$— | —$(CH_2)_kS(CH_2)_kOC(O)$— |
| —$(CH_2)_kSO_2NR_1'(CH_2)_kO(O)C$— | —$(CH_2)_kSO_2$— |
| —$SO_2NR_1'(CH_2)_kO$— | —$SO_2NR_1'(CH_2)_k$— |
| —$(CH_2)_kO(CH_2)_kC(O)O$— | —$CH_2)_kSO_2NR_1'(CH_2)_kC(O)O$— |
| —$(CH_2)_kSO_2(CH_2)_kC(O)O$— | —$CONR_1'(CH_2)_kC(O)O$— |
| —$(CH_2)_kS(CH_2)_kC(O)O$— | —$CH_2CH(OR_2')CH_2C(O)O$— |
| —$SO_2NR_1'(CH_2)_kC(O)O$— | —$(CH_2)_kO$— |
| —$(CH_2)_kNR_1'C(O)O$— | —$OC(O)NR_1'(CH_2)_k$— | wherein each k is independently an integer of 0 to about 20, $R_1'$ is hydrogen, phenyl, or alkyl containing 1 to about 4 carbon atoms, and $R_2'$ is alkyl-containing 1 to about 20 carbon atoms. Each structure is non-directional, that is, —$(CH_2)_kC(O)O$— is equivalent to —$O(O)C(CH_2)_k$—.

Preferably Z is a divalent alkylene (straight or branched chain) containing 1 to about 15 carbon atoms, the alkylene optionally containing one or more catenary heteroatoms. More preferably Z is —$C_nH_{2n}$—, wherein n is 1 to about 15.

Preferably Q is a covalent bond or divalent linking group represented by one of the following formulas:

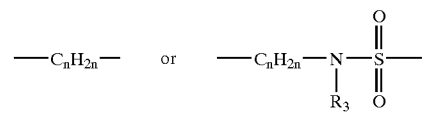

wherein n is an integer of 1 to about 15 (preferably 1 to about 4) and $R_3$ is hydrogen or a straight chain or branched chain alkyl containing 1 to about 6 carbon atoms.

Preparation of the fluorochemical (meth)acrylates and fluorocopolymers useful in the invention are known in the art and are described, for example, in U.S. Pat. No. 2,803,615 (Ahlbrecht et al.) and U.S. Pat. No. 2,841,573 (Ahlbrecht et al.), which are incorporated herein by reference in their entirety.

Preferably, the dyed fluoropolymers of the invention further comprise (meth)acrylic acid. Incorporating a small amount (preferably less than 2 weight percent) of (meth)acrylic into the fluoropolymer improves the adhesion of the coating to polar substrates such as, for example, the metallic surfaces of printed circuit boards. Preferred dyed fluoropolymers of the invention comprise (meth)acrylate/(meth)acrylic acid copolymers wherein the fluoroalkyl group has 12 or fewer carbon atoms (preferably 6 or fewer).

Preferably, the dyed fluoropolymers of the invention also comprise one or more hydrocarbon monomers. Suitable hydrocarbon monomers include, for example, (meth)acrylates containing 2 to about 20 carbon atoms and vinyls. Preferred hydrocarbon monomers include butyl methacrylate and lauryl methacrylate.

The dyed fluoropolymers of the invention comprise one or more olefinic functional dyes. Preferably, the dyed fluoropolymers of the invention comprise one or more (meth) acrylate functional dyes. The (meth)acrylate functional group is capable of reacting with a nucleophile to form a covalent bond either through addition or displacement. In the dyed fluoropolymers of the invention, the (meth)acrylate functional group of the dye copolymerizes with the fluoromonomer to form the dyed fluoropolymer. The dyed fluoropolymers are therefore highly resistant to leaching and blooming, which is an advantage over dyed polymers in which the dyes are fixed through adsorption or mechanical entrapment.

(Meth)acrylate functional dyes consist basically of three components: a dye moiety, a bridging or linking group, and the (meth)acrylate functional group. The dye can be fluorescent or non-fluorescent.

Fluorescent dye useful in the present invention include, for example, dyes from the coumarin, naphthalic acid derivatives, perylene, benzanthrone, benzothioxanthone, diketopyrrolopyrrole, rhodamine, cationic methine, and azomethine dye classes. A description of fluorescent dyes and their synthesis can be found, for example, in R. M. Christie, Rev. Prog. Coloration 23, 1–18 (1993).

Non-fluorescent dyes useful in the present invention include, for example, those from the azo, anthraquinone, benzodifurnanone, indigoid, quinophthalone, and sulfur classes of dyes.

Representative examples of (meth)acrylate functional dyes that are useful in the dyed fluoropolymers of the invention include:

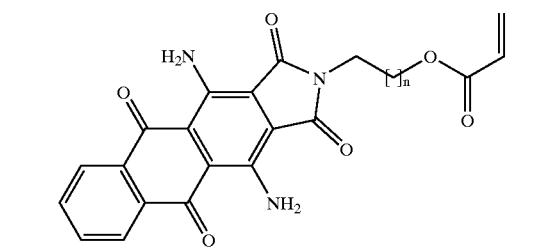

n = 1 to about 15

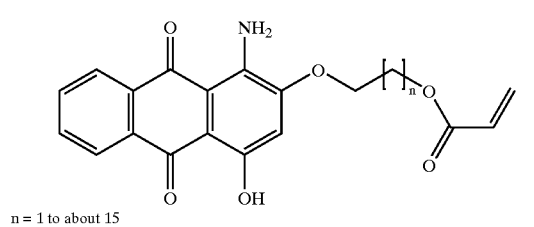

n = 1 to about 15

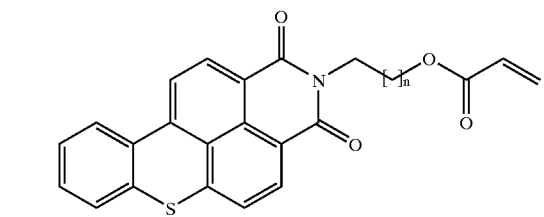

n = 1 to about 15

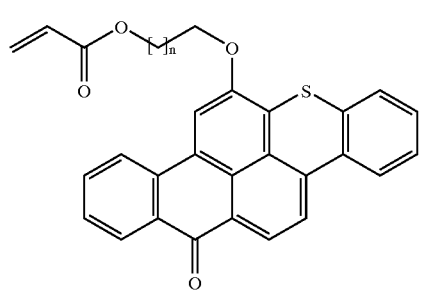

n = 1 to about 15

Preferably, the (meth)acrylate functional dyes are fluorescent. Preferred fluorescent (meth)acrylate functional dyes are those that are relatively more soluble in solvents such as, for example, acetone and hydrofluoroethers and the monomer mixture. Preferred fluorescent (meth)acrylate functional dyes include:

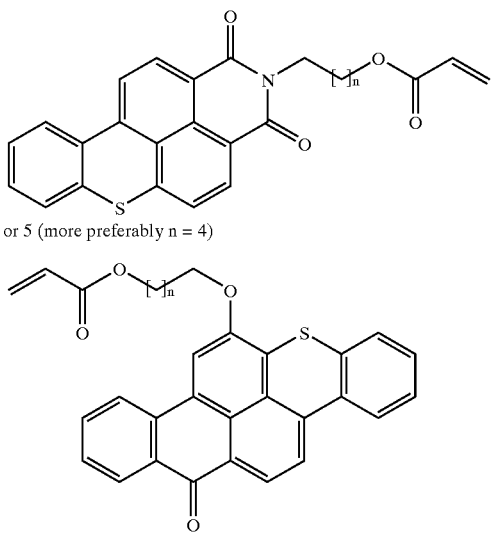

n = 4 or 5 (more preferably n = 4)

n = 7

The (meth) acrylate functional dyes can generally be prepared using methods known in the art. For example, first a chromogen is prepared. Typically, the chromogen is a cyclic, fused aromatic derivative containing the appropriate chromophores to achieve the desired absorbance/emission spectra characteristics. Alternatively, a commercially available dye chromogen such as, for example, 1-amino-2-bromo-4-hydroxyanthroquinone can be purchased. The chromogen can be reacted with reagents to prepare a hydroxy-functionalized dye derivative. The hydroxy-functionalized dye derivative can then be transformed to the corresponding (meth)acrylate functional dye by methods known in the art such as, for example, by esterification using acrylic acid or acrylol chloride, or by transesterification using methyl acrylate.

Dye loading in the dyed fluoropolymers of the invention generally varies depending upon the final application of the coating. Typically, however, the dyed fluoropolymers of the invention contain between about 0.001 and 3.0 weight percent of (meth)acrylate functional dye based upon the total polymeric content of the composition (preferably between about 0.01 and 2.0 weight percent).

The dyed fluoropolymers of the invention can be prepared by free radical solution polymerization of the fluorochemical (meth)acrylate monomers with the (meth)acrylate functional dye(s) (and optionally with (meth)acrylic acid and/or other hydrocarbon monomers) in any conventional solvent, including both fluorinated and non-fluorinated solvents. Typically, the dye is dissolved into the melted fluorochemical monomers or, if used, the hydrocarbon monomers before the solvent is added.

Preferably fluorinated solvents are used. More preferably, non-ozone depleting, non-flammable, and fast drying partially fluorinated (rather than perfluorinated) solvents such as, for example, hydrochlorofluorocarbons (HCFCs), hydrofluorocarbons (HFCs) and hydrofluoroethers (HFEs) are used. As used herein, the term "hydrofluorocarbon" means compounds consisting only of the elements carbon, hydrogen and fluorine, the term "hydrochlorofluorocarbon" means compounds consisting only of the elements carbon, hydrogen, fluorine and chlorine, and the term "hydrofluoroether" means compounds that contain carbon, hydrogen, fluorine, and at least one ether oxygen, and are free of chlorine, bromine and iodine.

Most preferably, one or more hydrofluoroethers or mixtures of one or more hydrofluoroethers with one or more other hydrofluorocarbons such as, for example, $CF_3CH_2CF_2CH_3$ are used. Hydrofluoroethers useful in this invention are typically liquid at ambient temperature and pressure, are non-ozone depleting and can be non-flammable. Non-flammable hydrofluoroethers (that is, hydrofluoroethers which do not exhibit a flash point when tested in a closed cup flash point test performed according to ASTM D 56-87) are preferred. Particularly preferred hydrofluoroethers are perfluoroalkyl alkyl ethers and more preferably, the hydrofluoroethers correspond to the following general formula:

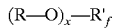

wherein x is 1 or 2, R is an alkyl group having from 1 to about 4 carbon atoms, and $R'_f$ is a fluoroaliphatic group.

$R'_f$ preferably comprises between about 2 to about 9 carbon atoms. When x is 1, $R'_f$ is preferably selected from the group consisting of a linear or branched perfluoroalkyl group, perfluorocycloalkyl group-containing perfluoroalkyl groups, perfluorocycloalkyl groups, linear or branched perfluoroalkyl groups having one or more catenary atoms, perfluorocycloalkyl-group-containing perfluoroalkyl groups having one or more catenary heteroatoms, and perfluorocycloalkyl groups having one or more catenary heteroatoms. When x is 2, $R'_f$ is preferably selected from the group consisting of linear or branched perfluoroalkylene groups, perfluorocycloalkyl group-containing-perfluoroalkylene groups, perfluorocycloalkylene groups, linear or branched perfluoroalkylene groups having one or more catenary atoms, perfluorocycloalkyl-group-containing perfluoroalkylene groups having one or more catenary heteroatoms, and perfluorocycloalkylene groups having one or more catenary heteroatoms.

Representative examples of hydrofluoroethers suitable for use in the invention include n-$C_4F_9OCH_3$, n-$C_4F_9OCH_2CH_3$, $CF_3CF(CF_3)$ $CF_2OCH_3$, $CF_3CF(CF_3)$ $CF_2OC_2H_5$, $C_8F_{17}OCH_3$, $CH_3O—(CF_2)_4—OCH_3$, $C_5F_{11}OC_2H_5$, $C_3F_7OCF_3$, $CF_3OC_2F_4OC_2H_5$, $C_3F_7OCF(CF_3)CF_2OCH_3$, $(CF_3)_2CFOCH_3$, $C_4F_9OC_2F_4OC_2F_4OC_2H_5$, and $C_4F_9O(CF_2)_3OCH_3$.

Typically an initiator is used to initiate polymerization. A wide range of molecules (for example, monoperoxycarbonates and peroxydicarbonates, perisononanoate, tert-amyl and tert-butylperesters, tert-amyl and tert-butyl perketal, bisperoxides, diazo compounds, and others) can be used as free radical sources for the initiation of polymerization.

The dyed fluoropolymers of the invention can be used in coating compositions. Coating compositions comprising the dyed fluoropolymers of the invention can further comprise a solvent. Any solvent in which the dyed fluoropolymer dissolves to a suitable degree, which does not deleteriously affect the substrate, and which does not leave a harmful residue can be used. It is preferable, however, to use the same solvent that was used in the polymerization reaction. Therefore, preferences for coating solvents are the same as the preferences stated for polymerization solvents.

Typically, the coating composition comprises up to about 50 weight percent dyed fluoropolymer (preferably up to about 35 weight percent; most preferably up to about 28 weight percent). The resulting coatings are generally less than about 3 mils (0.08 mm) thick, but the desired thickness depends upon the specific application. Thicker or thinner coatings can be prepared if desired, typically by selection of the solvent(s) (for example, $C_4F_9OCH_3$) and/or concentration of the fluoropolymer in the coating composition. The coating composition can be applied to a substrate or article using any suitable means known in the art such as, for example, brushing, dipping, spraying, and flow coating. An advantage of the invention is that the composition-coated substrate or article can be allowed to air dry, no curing mechanism is required.

It has been discovered that the coating compositions of the invention meet the thickness and dielectric withstand requirements of IPC-CC-830 and can be used as conformal coatings for electronic components and circuit board assemblies. Conformal coatings comprising the dyed fluoropolymers of the invention are chemically stable and more thermally stable than many common conformal coating materials. They are therefore well suited for high temperature applications where silicone conformal coatings have traditionally been used, and at least some coating compositions of the invention appear to have better adhesion properties than silicone.

Circuit board components and assemblies can be coated with the present coating composition to insulate them from contaminants and preserve their electronic functions. Circuit board assemblies can be coated before or after the components have been mounted, but they are typically conformally coated after they have been completely assembled and soldered.

Proper coverage and uniformity of the conformal coating over the assembly is critical for effective protection of the assembly. The (meth)acrylate functional dye of the coating compositions of the invention aids in the quality assurance inspection of the circuit board assembly for proper coverage of the coating.

The fluorescent dyed fluoropolymers of the invention can be readily observed by the human eye using, for example, "black light" or on-line with an electro-optical device. When a fluorescent (meth)acrylate functional dye is used, coating thickness (or coating weight) can be measured on-line using techniques in which the dye is excited by optical radiation and the thickness of the coating is determined by the magnitude of the emitted fluorescent radiation.

The coating compositions of the invention can also be used in many other anti-corrosion, anti-migration, anti-stiction, and particulate shedding protection applications such as, for example, flat panel displays, pellicles, semiconductor chips, wafers, and components, microelectromechanical systems (MEMS), fiber optic components, cellular phone components, medical respiratory masks, and in any application in which sensitive materials require protection from their environment.

EXAMPLES

The invention will be further explained by the following illustrative examples which are intended to be non-limiting.

| Descriptor | Description, Formula and/or Structure | Availability |
|---|---|---|
| | Glossary Table | |
| Acryloyl chloride | CH$_2$=CHCOCl | Sigma-Aldrich, Milwaukee, WI |
| AD-1 | *structure shown; where n = 4* | See preparation below |
| AD-2 | *structure shown* | See preparation below |
| AD-3 | *structure shown; where n = 5* | See preparation below |
| AD-4 | *structure shown; where n = 1* | See preparation below |
| AD-5 | *structure shown; where n = 7* | See preparation below |

-continued

Glossary Table

| Descriptor | Description, Formula and/or Structure | Availability |
|---|---|---|
| AD-6 | [structure: thioxanthone-fused naphthalimide with N-(CH₂)ₙ-O-C(O)-CH=CH₂ acrylate side chain] | See preparation below |
| AD-7 | [structure: thioxanthone-fused naphthalimide isomer with N-(CH₂)ₙ-O-C(O)-CH=CH₂ acrylate side chain] where n = 5 | See preparation below |
| 1-amino-2-bromo-4-hydroxyanthroquinone | [structure: anthraquinone with NH₂, Br, OH substituents] | Aceto Chemical Co., Lake Success, NY |
| 1,4-diamino-2,3-dicyano anthraquinone | [structure: anthraquinone with two NH₂ and two CN substituents] | Aceto Chemical Co., Lake Success, NY |
| 5-amino-1-pentanol | $NH_2(CH_2)_5OH$ | Sigma-Aldrich |
| 2-amino-1-ethanol | $NH_2(CH_2)_2OH$ | Sigma-Aldrich |
| 6-amino-1-hexanol | $NH_2(CH_2)_6OH$ | Sigma-Aldrich |
| 2-aminothiophenol | [structure: benzene with SH and NH₂ ortho substituents] | Sigma-Aldrich |
| BMA | Butyl methacrylate | Sigma-Aldrich |
| 4-chloronaphthalic anhydride | [structure: 4-chloro-1,8-naphthalic anhydride] | Acros Organics, Pittsburgh, PA |
| 8-chloro-1-octanol | $Cl(CH_2)_8OH$ | Sigma-Aldrich |
| CYTA | Conap ™ CE-1170 acrylic conformal coating | Cytec, Olean, NY |
| DMF | dimethylformamide; $(CH_3)_2NC(O)H$ | Sigma-Aldrich |
| DOWS | Dow ™ 3-1765 silicone conformal coating | Dow Corning, Midland, MI |
| ethylene carbonate | [structure: ethylene carbonate ring] | Sigma-Aldrich |
| HAS | HumiSeal ™ 1B-31 acrylic conformal coating | Humiseal, Woodside, NY |

-continued

Glossary Table

| Descriptor | Description, Formula and/or Structure | Availability |
|---|---|---|
| HFE-7100 | 3M ™ NOVEC ™ HFE-7100; $C_4F_9OCH_3$ perfluorobutyl methyl ether | 3M Company, St. Paul, MN |
| HFE-7200 | 3M ™ NOVEC ™ FLUID HFE-7200; $C_4F_9OC_2H_5$ perfluorobutyl ethyl ether | 3M Company |
| HFE-72DE | 3M ™ NOVEC ™ HFE-72DE (HFE-7100 (10%), HFE-7200 (20%), and trans-dichloroethylene (70%)) | 3M Company |
| 2-hydroxy benzanthrone | 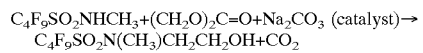 | Can be prepared according to U.S. Pat. No. 4,036,859 (Example 1 and 2) |
| LMA | Lauryl methacrylate | Sigma-Aldrich |
| LUPEROX | Luperox ™ 26M50, t-butyl peroctoate (50%) | Atofina Chem., Philadelphia, PA |
| MAA | Methacrylic acid | Sigma-Aldrich |
| NBS | N-bromosuccinimide | Sigma-Aldrich |
| sodium nitrite | $NaNO_2$ | Sigma-Aldrich |
| tetraethyl ammonium iodide | $(C_2H_5)_4NI$ | Sigma-Aldrich |
| triethyl amine | $N(C_2H_5)_3$ | Sigma-Aldrich |

Preparation 1: Synthesis of MeFBSEA
Ethoxylation of MeFBSA with Ethylene Carbonate
Reaction:

$$C_4F_9SO_2NHCH_3+(CH_2O)_2C=O+Na_2CO_3 \text{ (catalyst)} \rightarrow C_4F_9SO_2N(CH_3)CH_2CH_2OH+CO_2$$

Charges:
A. 100 g MeFBSA ($C_4F_9SO_2NHCH_3$, MW=313, 0.32 moles)
B. 2.8 g $Na_2CO_3$ (0.026 moles)
D1. 8 g ethylene carbonate (MW=88) (available from Sigma-Aldrich, Milwaukee, Wis.) melted in oven at 50° C.
D2. 8 g ethylene carbonate
D3. 8 g ethylene carbonate
D4. 10 g ethylene carbonate (total weight=34 g, 0.38 moles)
E. 300 ml water
F. 300 ml water
G. 300 ml 3 wt % sulfuric acid
H. 300 ml water
I. 300 ml water
J. 300 ml water Procedure:
1. Charges A and B were placed in a one liter 3-necked flask with an overhead stirrer, thermocouple, addition funnel, and reflux condenser.
2. The batch was heated to 60° C. (140° F.) at which point the batch was molten and stirring was begun. The set point was increased to 120° C. (248° F.).
3. When the batch reached 120° C., Charge D1 was removed from the oven and transferred to the addition funnel. Charge D1 was then added slowly over a period of 10 minutes. Outgasing (carbon dioxide) was observed. Thirty minutes elapsed until the rate of outgasing was noticed to have diminished.
4. Charge D2 was then transferred to the addition funnel and added over a period of 5 minutes. After 25 minutes, the rate of outgasing had slowed and Charge D3 was added over a 5 minute period. After 30 minutes, Charge D4 was removed from the oven, added to the addition funnel, and added to the batch over a 5 minute period.
5. The set point was reduced to 110° C. (230° F.) and allowed to stir overnight.
6. In the morning, the batch was cooled to 90° C. (194° F.) and the batch was sampled. Gas chromatographic (GC) analysis showed the material to be 96.1% desired product and to contain no amide. Charge E was added. The batch was stirred for 30 minutes, allowed to phase split and the upper water phase was vacuum decanted off. The operation was repeated for Charge F at 63° C. (145° F.).
7. The batch was then agitated with Charge G for 30 minutes at 63° C. (145° F.), then was phase split, and vacuum decanted. The pH of the water layer was tested and found to be less than 2.
8. The batch was then washed with water charges H, I, and J successively at 63° C. (145° F.).
9. The batch was melted and poured out of the flask into a bottle and allowed to solidify. A small amount of water on top of the resulting solid was poured off, and the remaining solid material in the jar was found to weigh 124 g.
10. The solid material was melted into a two-necked 500 ml flask. The melting point was found to be 57° C. (135° F.).

11. The resulting liquid material (113 g) was distilled at 667–933 Pa (5–7 torr Hg). 104 g (92% of undistilled material) distilled at a head temperature of 130–137° C. (266–279° F.) and a pot temperature of 136–152° C. (277–306° F.). Further increase of the pot temperature to 170° C. (338° F.) resulted in no further material distilling over.

Preparation of MeFBSEA (N-methyl-(perfluorobutanesulfonamido)ethyl acrylate)

Reaction:

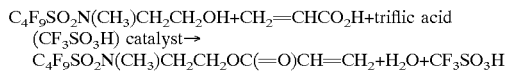

$C_4F_9SO_2N(CH_3)CH_2CH_2OH+CH_2=CHCO_2H+$triflic acid $(CF_3SO_3H)$ catalyst→
$C_4F_9SO_2N(CH_3)CH_2CH_2OC(=O)CH=CH_2+H_2O+CF_3SO_3H$ Charges:
A. 112 g MeFBSE alcohol ($C_4F_9SO_2N(CH_3)CH_2CH_2OH$, 0.313 moles)
B. 0.07 g phenothiazine (available from Sigma-Aldrich, Milwaukee, Wis.)
C. 0.11 g methoxyhydroquinone (MEHQ) (available from Sigma-Aldrich, Milwaukee, Wis.)
D. 100 g heptane
E. 27.5 g acrylic acid (0.38 moles)
F. 1 g anhydrous triflic (trifluoromethanesulfonic) acid (available as FC-24 from 3M, St. Paul, Minn.)
G. 300 g water
H. 300 g water Procedure:
1. Charges A, B, C, D, E and F were added to a 3-necked flask equipped with decanter assembly, overhead stirrer, and a thermocouple under positive nitrogen pressure.
2. The flask was warmed to 60° C. and the stirring was begun. The batch was stirred at reflux which was initially at 96° C. and rose to 102° C. by the end of the reaction. The theoretical water that should be collected in the decanter was 6.3 ml. After 15 minutes of refluxing, 2 ml had collected. After 1 hour and 15 minutes, the reflux temperature was 99° C. and 5 ml had collected. After 5 hours and 15 minutes the reflux temperature was 102° C. and 5.4 ml had collected. A sample was withdrawn from the batch and GC analysis showed no unreacted alcohol, 92.6% desired product and 7.4% high boiler.
3. The batch was stripped atmospherically to the decanter until at 103° C. no more heptane collected in it.
4. The batch was cooled to 64° C. and vacuum was pulled slowly. More heptane was stripped off until at 5 torr no more liquid was observed to be distilling off.
5. Vacuum was broken and Charge G was added. The batch was stirred at 64° C. for 15 minutes, allowed to phase spilt and the upper layer was vacuumed off.
6. This operation was repeated with Charge H and then the batch was allowed to cool to room temperature at which point the product was a solid. The remaining water was poured off and the product material was melted out of the container into a jar. The weight of the product was 125 g (theoretical 129 g). GC analysis showed the material to be 92.64% desired acrylate and 7.36% acrylic acid Michael adduct.

Preparation 2: Synthesis of MeFBSEMA

MeFBSEMA (N-methyl-(perfluorobutanesulfonamido)ethyl methacrylate) was prepared as described in Preparation 1 above, except using methacrylic acid in place of acrylic acid Preparation 3: Synthesis of AD-1

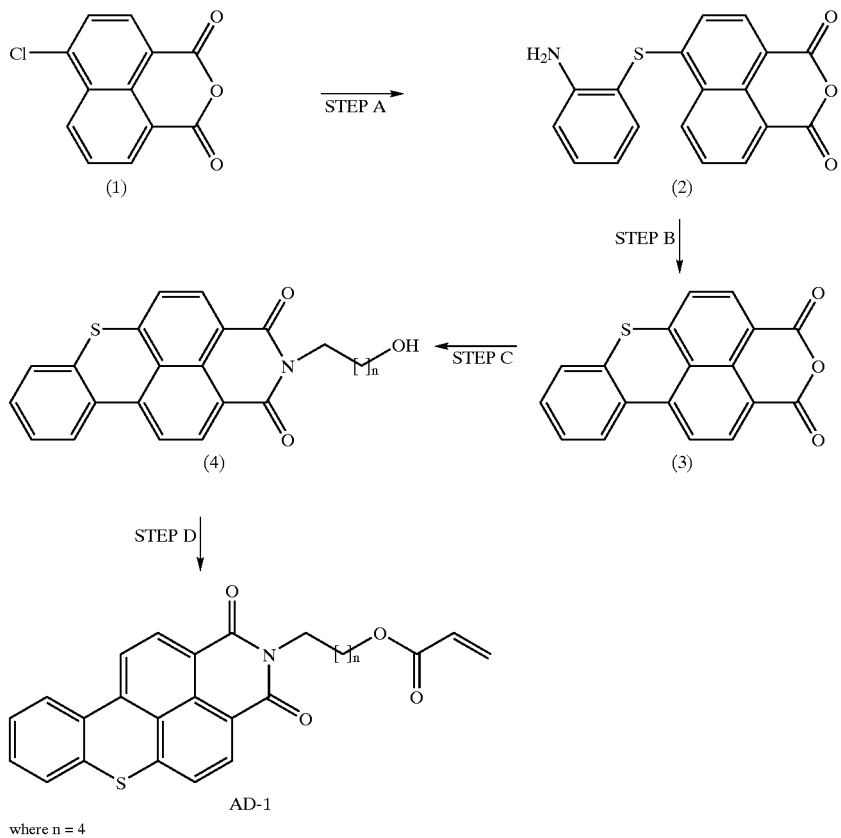

where n = 4

Step A: Preparation of (2)

A 1000 mL round bottom flask equipped with a heating mantle, stirrer and dropping funnel was charged with 4-chloronaphthalic anhydride ((1), 125 g, 0.54 moles), potassium carbonate (36.9 g, 0.27 moles), 215 g isopropyl alcohol, and 322 g sulfolane and heated to about 50° C. 2-aminothiophenol (73.9 g moles) was added dropwise so that the temperature was maintained below 80° C. The mixture was then heated to 90° C. and held for 3 hours. The mixture was cooled to 15° C. and the resulting orange precipitate was recovered via filtration with a Buchner funnel. The solid was resuspended in DI water (470 g) and then filtered using a Buchner funnel. The solid was dried and analysis via $^{13}C$ NMR confirmed the structure (2).

Step B: Preparation of (3)

A 5000 mL round bottom flask fitted with a dropping funnel and immersed in an ice-water cooling bath was charged with (2) (241.0 g, 0.75 moles) and 3600 g DMF. HCl (600 g, concentrated) was slowly added dropwise, keeping the temperature below 15° C. An aqueous solution of sodium nitrite (52.5 g, 21%) was added and the reaction mixture was stirred for two hours, maintaining the temperature below 5° C. $CuSO_4 5H_2O$ (3.0 g, 0.012 moles) was added and a mild exotherm occurred. The cooling bath was then replaced with a heating mantle, and nitrogen gas evolved as the temperature was slowly elevated to 100° C. and held for 3 hours. The mixture was cooled to ambient temperature (~25° C.) and filtered using a Buchner funnel. The resulting solid was resuspended in DI water (1000 g) and filtered again using a Buchner funnel. The solid (3) was dried to yield 171 g (75% of the theoretical material).

Step C. Preparation of (4)

A 1000 mL round bottom flask fitted with a condenser was charged with (3) (40.0 g, 0.13 moles), 5-amino-1-pentanol (13.5 G, 0.13 moles) and DMF (240 g) and the ensuing mixture was heated to reflux (~155° C.) for 3 hours. After it was determined that no starting material remained (via thin layer chromatography (TLC) in ethyl acetate) the mixture was cooled to 80° C. and 400 g DI water was added, keeping the temperature between 70–80° C. until all the water was added. The resulting suspension was then filtered using a Buchner funnel and the solid material was resuspended in 500 g DI water and filtered again using a Buchner funnel. The yield of resulting material (4) was 41 g.

Step D: Preparation of AD-1

A one liter three neck round bottom flask fitted with an overhead stirrer and dropping funnel was charged with (4) (25.0 g; 0.062 moles), dimethyl formamide (310.0 g) and triethyl amine (8.15 g; 0.08 moles). The resulting mixture was stirred and heated to 40° C. at which time acryloyl chloride (6.44 g, 0.07 moles) was added drop wise to the mixture over 30 minutes while keeping the temperature at approximately 40° C. After two hours, additional triethyl amine (3.0 g) and acryloyl chloride (2.2 g) were added. The resulting mixture was stirred for another hour and then cooled to 20° C. Deionized (DI) water (500.0 g) was added to the cooled mixture and solid AD-1 was isolated via filtration with a Buchner funnel. AD-1 was re-suspended in DI water (700.0 g), filtered using a Buchner funnel and air dried (yielding 24.7 g; 96% purity of AD-1. The structure and purity were confirmed via $^{13}C$ nuclear magnetic resonance (NMR) analysis.

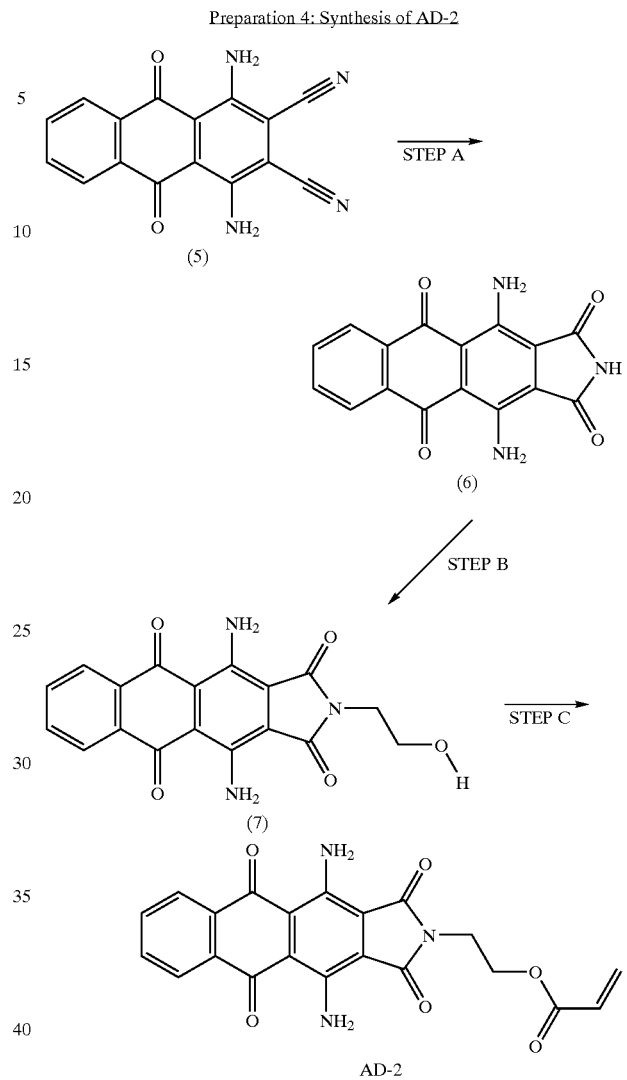

Preparation 4: Synthesis of AD-2

Step A: Preparation of (6)

A 1 liter three neck round bottom flask was charged with 630 g sulfuric acid. The solution was stirred and heated to 80° C. 1,4-diamino-2,3-dicyano anthraquinone ((5)123.4 g 0.43 moles) was added to the flask, using a water bath and heating mantle to control the reaction temperature at 140–150° C. Once all of the anthraquinone was added, the reaction temperature was held at 150° C. for one hour. The reaction mixture was then cooled to 40° C. and 255 g water was added, using cooling to control the exotherm to below 50° C. and then cooled to room temperature.

The reaction mixture was filtered through a glass frit funnel. The resulting solid filtrate was washed with water. About 500 g additional water was added and the solid was filtered again. The resulting solid (6) was air dried and used in the following steps.

Step B: Preparation of (7)

A one liter three neck round bottom flask was charged with 60 g (0.22 moles) of the (6), 320 g 1,2-dichlorobenzene and 26.6 g (0.44 moles) 2-amino-1-ethanol (both available from Aldrich). A dean-stark trap and condenser, and a mechanical stirrer were used. The batch was heated to about 120° C., distilling out a small amount of solvent and water. Gradually the batch temperature was raised to 150° C. and held for three hours. TLC (in ethyl acetate) showed no residual (6).

The batch was cooled to room temperature and about 400 g methanol was added. The resulting mixture was filtered through a buchner funnel. About 500 g. water and 25 g. concentrated HCl was added to the resulting solid. The mixture was stirred and filtered, and then repeated. The resulting blue solid (7) was air dried and used in the following step.

Step C: Preparation of AD-2

For the preparation of AD-2 the procedure described in Preparation 3 (step D: preparation of AD-1) was essentially followed, substituting 7 (0.062 moles) for 4.

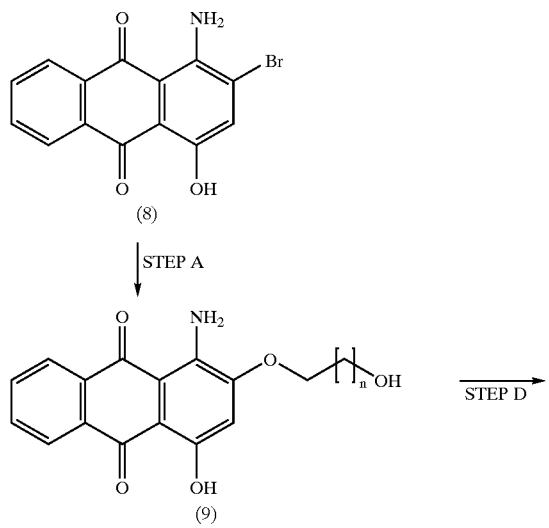

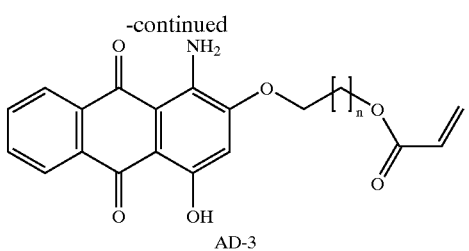

where n = 5

Step A: Preparation of (9)

A three neck 250 ml round bottom flask was charged with 25 g (0.079 moles) of 1-amino-2-bromo-4 hydroxy anthraquinone (8), 54.5 g (0.55 moles) of 1-methyl-2-pyrollidinone, 92 g (0.78 moles) 1,6-hexane-diol, 8.8 g (0.94 moles) phenol, and 12 g (0.086 moles) potassium carbonate (all available from Aldrich). The batch was heated to 125° C. and held for 12 hours. TLC (in ethyl acetate) found no residual starting material.

The reaction was cooled to 50° C. and 150 g methanol was added. The reaction was then cooled to room temperature and filtered with a buchner funnel. 300 g methanol was added to the resulting solid and then stirred and filtered. The resulting solid product was dried in an oven at 100° C. The yield was 19.8 g. $^{13}$C NMR analysis shows the material was 94% pure of (9).

Step B: Preparation of AD-3

For the preparation of AD-3, the procedure described in Preparation 3 (Step D: preparation of AD-1) above was essentially followed, substituting (9) (0.062 moles) for (4).

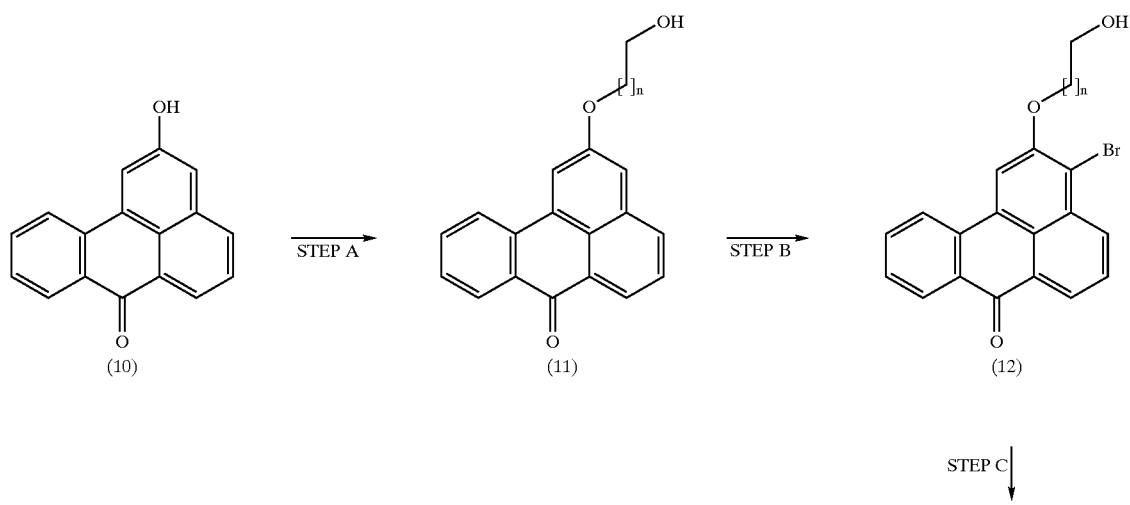

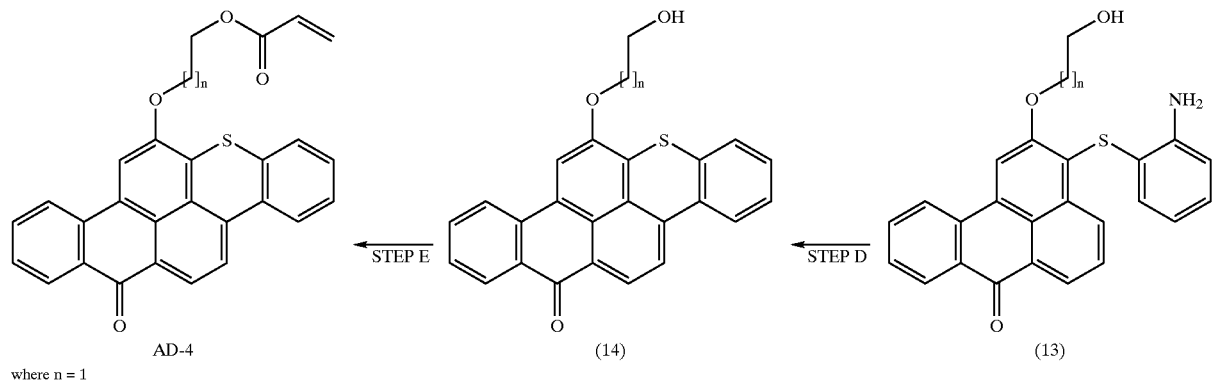

where n = 1

Step 1: Preparation of (11)

A 1 L three neck round bottom flask equipped with a mechanical stirrer and thermometer was charged with 2-hydroxy benzanthrone ((10), 75.0 g; 0.3 mole), ethylene carbonate (35.0 g; 0.4 mole), tetraethylammonium iodide (18.0 g; 0.07 mole) and dimethylformamide (300.0 g). The ensuing mixture was heated at reflux for 15 hours, and additional ethylene carbonate (25.0 g; 0.3 mole) and tetraethylammonium iodide (8.0 g; 0.03 mole). The resulting mixture was cooled to ambient temperature and DI water was added (200.0 g). The precipitate was filtered, allowed to air dry and recrystallized in isopropyl alcohol (yielding 70 g. of (11)).

Step 2: Preparation of (12)

A 1 L three neck round bottom flask equipped with a mechanical stirrer and condenser was charged with 11 (70.0 g; 0.24 mole), NBS (53.0 g; 0.3 mole) and dimethylformamide (500.0 g). The ensuing stirred mixture was heated to about 55° C. for 3 hours, cooled to ambient temperature and DI water (500.0 g) was added. The aqueous mixture was extracted with chloroform (250.0 g). This organic extract was then washed three times with DI water (500.0 g aliquots), chloroform was removed using a rotary evaporator, and the resulting yellow material (12) was oven dried (75 g; 88% yield).

Step 3: Preparation of (13)

A 500 mL three neck round bottom flask equipped with a mechanical stirrer and condenser was charged with 12 (73.0 g; 0.2 mole), sodium carbonate (14.4 g; 0.13 mole), 2-aminothiophenol (27.5 g; 0.22 mole) and dimethylformamide (300.0 g). The ensuing mixture was stirred and heated at reflux for 3 hours, cooled to ambient temperature, and filtered. The yellow solid material was washed with DI water (20.0 g), filtered and oven dried to yield (13) (22.0 g; 22% yield).

Step 4: Preparation of (14)

A 1 L three neck round bottom flask equipped with a mechanical stirrer and dropping funnel was charged with (13) (20.6 g: 0.05 mole) and dimethylformamide (300.0 g). The ensuing mixture was cooled to 20° C. using an ice bath, and HCl (55.0 g; concentrated) was slowly added dropwise, keeping the temperature at or below 20° C. With continued cooling, an aqueous solution of sodium nitrite (24.0 g; 16.6%) was added dropwise over a period of one hour, keeping the temperature at or below 5° C. Upon completion of the addition, the cooled mixture was stirred for an additional 2 hours. The cooling bath was removed and replaced with a heating mantle. $Cu(SO_4)_2$ (0.3 g) was added to the mixture and a temperature of 130° C. was maintained for 3 hours. The mixture was then cooled to ambient temperature and filtered. The filtered solid was re-slurried with DI water (200.0 g), filtered and oven dried to yield (14) (14.0 g; 71% yield; mp 301–303° C.). Structure and purity (>90%) were confirmed using $^{13}C$ NMR.

Step 5: Preparation of AD-4

A 1 L three neck round bottom flask equipped with a mechanical stirrer and dropping funnel was charged with (14) (25.0 g; 0.063 mole) dimethylformamide (690 g.) and triethyl amine (7.65 g; 0.075 mole). The ensuing stirred mixture was heated to 40° C. and acryloyl chloride (6.3 g; 0.07 mole) was added dropwise over 0.5 hour. The resulting mixture was maintained at 40° C. for 3 hours, cooled to 20° C. in an ice bath, and DI water (500.0 g) was added. The precipitate was filtered from the filtrate using a Buchner funnel and the solid was washed three times with DI water (500.0 g each aliquot) to yield a AD-4 (35.0 g). Structure and purity (>95%) were confirmed using $^{13}C$ NMR.

Preparation 7: Sythesis of AD-5

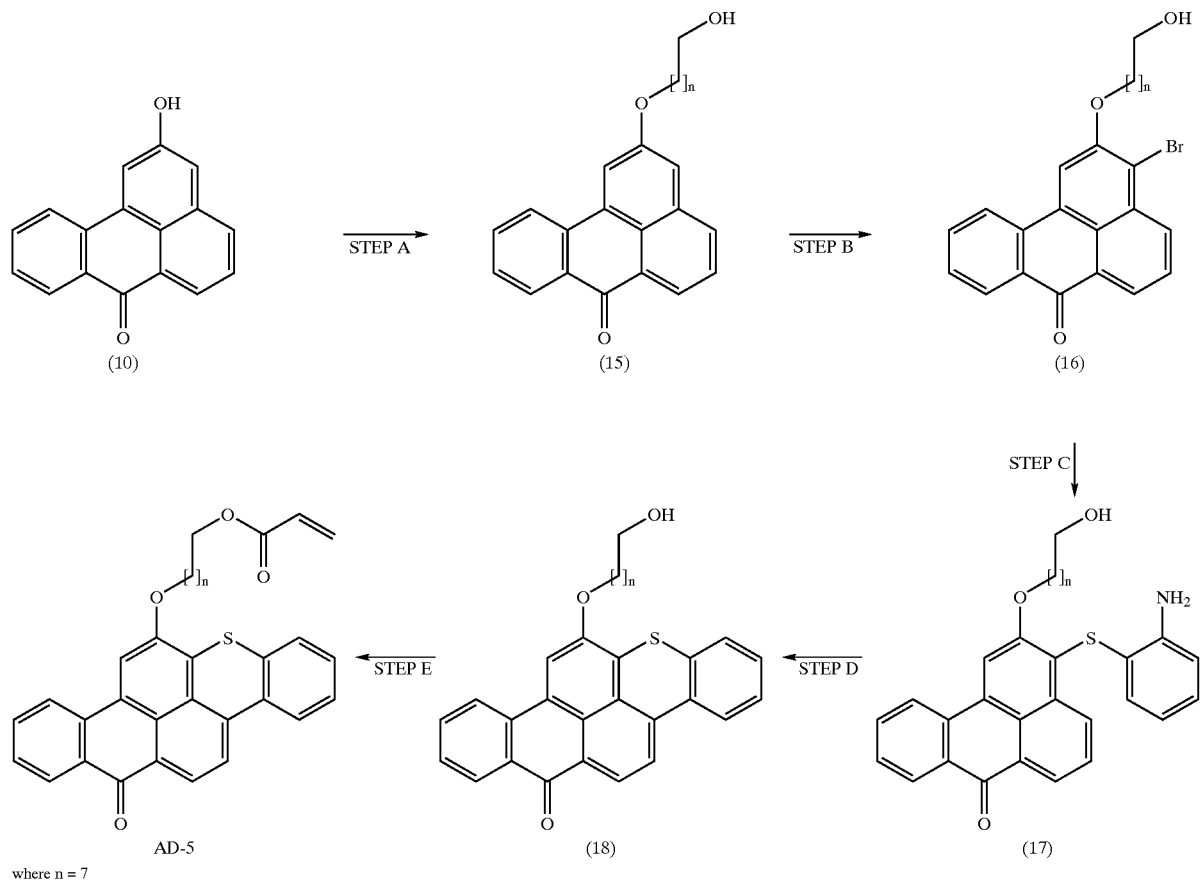

where n = 7

The preparation of AD-5 (where n=7) essentially follows the description of the preparation for AD-4 (where n=1) above with the exception that Step A was replaced by the following:

A 500 mL three neck round bottom equipped with a mechanical stirrer, condenser and addition funnel was charged with 1 (30.0 g; 0.12 mole), DI water (200 g.) NaI (1.8 g; 0.12 mole) and aqueous NaOH in (19.4 g; 50%). The stirred mixture was heated to reflux and 8-chloro-1-octanol (40.1 g, 0.24 mole) was added dropwise over 1.5 hours. The temperature was maintained for 2 additional hours, then cooled to ambient temperature, filtered and the resulting solid (15) was air dried (35.8 g). The stoichiometric equivalent of this material was then used in the succeeding steps outlined above to ultimately yield AD-5 (where n=7).

Preparation 8: Synthesis of AD-6

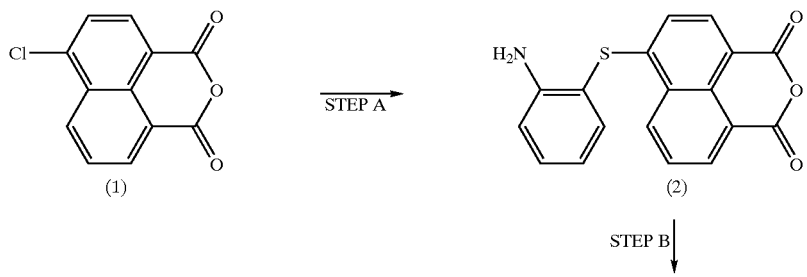

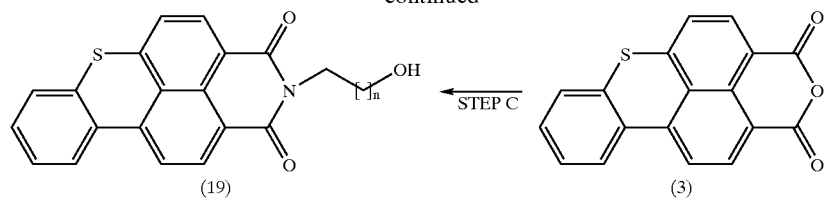

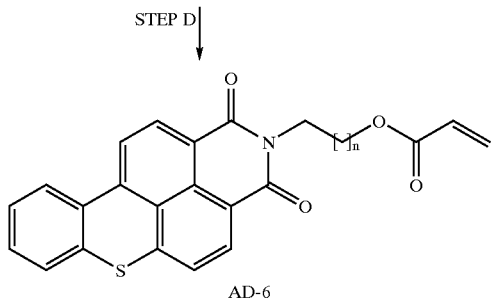

AD-7 was prepared essentially according to the preparation followed for synthesis of AD-1 with the exception that in Step C, 2-amino-1-ethanol (0.13 moles) was used instead of 5-amino-1-pentanol. In the synthesis of the acrylate dye, AD-6, a stoichiometric equivalent of 19 was used.

AD-7 was prepared essentially according to the preparation followed for synthesis of AD-1 with the exception that in Step C, 6-amino-1-hexanol (0.13 moles) was used instead of 5-amino-1-pentanol. In the synthesis of the acrylate dye, AD-6, a stoichiometric equivalent of 20 was used.

Preparation 9: Synthesis of AD-7

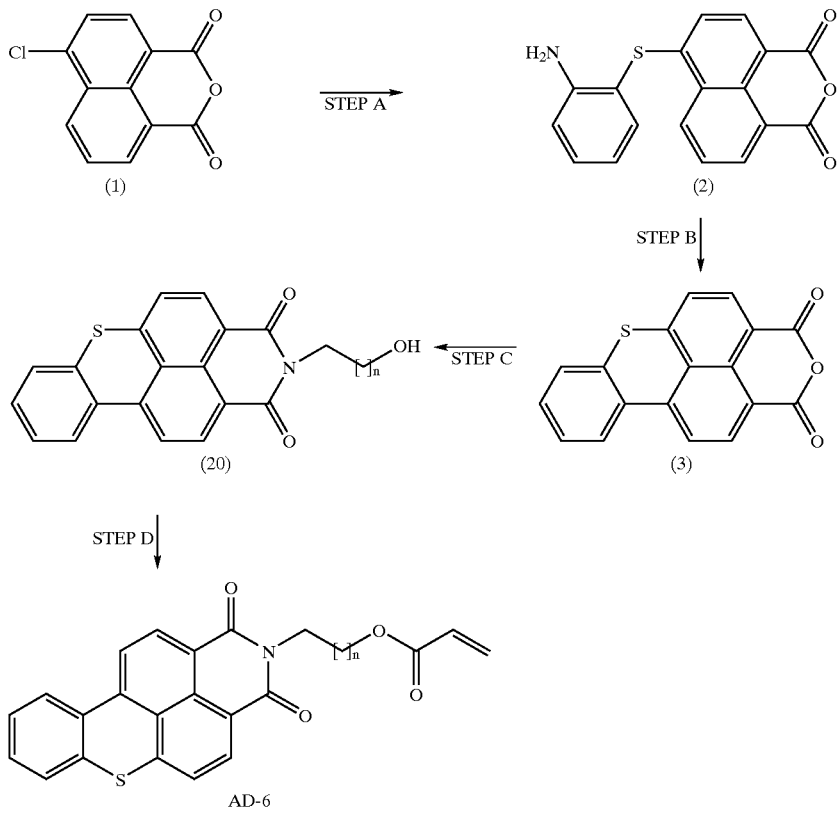

Coating and Test Methods
Dip Coating Method

Each substrate (described below) was wiped with ethanol using a Kimwipe™ sheet (available from Kimberly Clark, Roswell, Ga.) and then ultrasonically treated in a warm bath of HFE-72DE for about 5 minutes, removed, and allowed to air dry at ambient conditions. The substrates were then dipped into solutions of the fluoropolymer to be tested and withdrawn at a constant rate of 5.3 in/min (13.46 cm/min). Each coated substrate was then air dried at ambient temperature (~72° F. (~22° C.)) and visually inspected for a uniform, blemish-free coating.

Coating Thickness Test Method

Coating thickness was measured with a micrometer at six points (top ⅓, middle ⅓ and bottom ⅓) on the front and back of each coated substrate [both]. Average values are reported below in Table 1.

Flexibility Test Method

Tin coated steel panels (3 inch (7.6 cm)×5 inch (12.7 cm), 0.0107 inch (0.027 cm) thick) were coated with solutions of fluoropolymer as described above. The coated panels were bent 180° over a 0.125 inch (0.32 cm) diameter mandrel. The coating on each panel was then visually inspected and evaluated for cracks, crazes, or delaminations using a 6× magnifying loupe. If any cracks, crazes, or delaminations were observed, the coating failed this test. Results are reported below in Table 1.

Dielectric Withstanding Voltage Test Method

IPC-B-25A test boards (available from T.R.C. Circuits, Inc., Minneapolis, Minn.) were coated with solutions of fluoropolymer as described above. The D pattern on each IPC-B-25A test board was subjected to an increasing bias from 0 to 1500 V over 15 seconds and then held for one minute at 1500 V. If the board exhibited flashover, sparkover or breakdown, the coating failed this test. Results are reported below in Table 1.

Visual Test for Coating Uniformity

Coating uniformity was qualitatively determined by placing substrates coated as described above under a black light (Standard fluorescent desk lamp fitted with two 18 inch (45 cm) GE 15 W blacklights) and inspecting for fish eyes or other coating defects.

Thermal Gravimetric Analysis (TGA)

The thermal decomposition of each conformal coating material was determined by thermal gravimetric analysis (TGA) under an inert nitrogen atmosphere using a 10° C. per minute temperature ramp using a Perkin Elmer Thermogravimetric Analyzer TGA 7 (Perkin Elmer Instruments, Norwalk, Conn.). Results are shown in FIG. 1.

Solubility in Acetone

Solubility of the dyes in acetone was determined by weighing a small amount of dye into a jar and adding small aliquots of acetone until no undissolved dye remained. Results are listed below in Table 2.

Solubility in Acrylate Monomer

Solubility of the dyes was determined in various acrylate monomers using standard fluorescence measurement techniques (SPEX Fluorolog-3 Spectrophotometer, SPEX Industries, Edison, N.J.). Results are listed below in Table 3.

Comparativ Examples C1 —C3

Comparative examples C1–C3 were prepared using 3 commercially available conformal coating materials (C1 is HAS, C2 is CYTA, C3 is DOWS). Commercial samples were dried in an oven for 80° C. for two hours, the resulting solid was placed in a pan and subjected to TGA at 200° C.

Example 1

A 600 mL Parr reactor (available from Parr Instrument Co., Moline, Ill.) was charged with MeFBSEA (146.30 g; 0.36 moles), MeFBSEMA (10.03 g; 0.023 moles), BMA (3.34 g; 0.023 moles), LMA (5.85 g; 0.023 moles), MAA (1.67 g; 0.020 moles) and AD-1 (0.011 g). Upon dissolution of the charges, LUPEROX (9.24 g) and HFE-7100 (440.80 g) were added. The reactor was then sealed and degassed four times, by pulling a vacuum of 5–10 psig (34–68 kPa) and then purging with nitrogen. The reactor temperature was then elevated and held at 80° C. for about 24 hours. The resulting reaction mixture was filtered. The resulting filtered solution was used to coat substrates for testing.

Example 2

The procedure described for Example 1 was followed for the preparation of Example 2, with the exception that AD-1 was replaced with AD-2 and the AD-2/polymer charge was mildly heated in an oven to 80° C.

Example 3

The procedure described for Example 1 was followed for the preparation of Example 3, with the exception that AD-1 was replaced with AD-3.

Comparative Example C4

Comparative Example C4 was prepared according to the procedure described for Example 1, with the exception that the addition of AD-1 was omitted.

TABLE 1

| Ex. | Dye | Coating Thickness (mm) | Flexibility Test | Dielectric Withstand Test | Visual Test |
|---|---|---|---|---|---|
| 1 | AD-1 | 0.0464 | Passed | Passed | Passed |
| 2 | AD-2 | 0.0474 | Passed | Passed | Passed |
| 3 | AD-3 | 0.0489 | Passed | Passed | Passed |
| C4 | No dye | 0.0468 | Passed | Passed | Passed |

TABLE 2

Solubility of dye in acetone

| Dye | Solubility (g acetone/mg of dye) |
|---|---|
| AD-1 | 0.83 |
| AD-4 | 11.0 |
| AD-5 | 0.65 |
| AD-6 | 11.6 |
| AD-7 | 0.83 |

TABLE 3

Solubility of dyes in acrylate monomers

| Dye | Acrylate Monomer | Solubility (μg dye/mL of acrylate monomer) |
|---|---|---|
| AD-6 | LMA | 227 |
| AD-7 | LMA | 114 |
| AD-1 | LMA | 816 |
| AD-6 | BMA | 559 |
| AD-7 | BMA | 301 |
| AD-1 | BMA | 1217 |

What is claimed:

1. A dyed fluoropolymer comprising the reaction product of (a) one or more fluorochemical (meth)acrylate monomers and (b) one or more (meth)acrylate functional dyes.

2. The dyed fluoropolymer of claim 1 represented by the following formula:

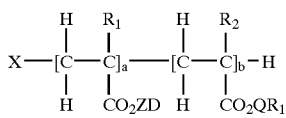

wherein the sum of a+b is a number such that the compound is polymeric,
$R_1$ is hydrogen methyl,
$R_2$ is a straight chain or branched chain alkyl containing 1 to about 4 carbon atoms,
Z is an organic divalent linking group,
D is a dye moiety,
Q is a covalent bond or an organic divalent linking group,
$R_f$ is a fluoroaliphatic group that comprises a fully fluorinated terminal group having 12 carbon atoms or less, and
X is a hydrogen atom or a group derived from a free radical initiator.

3. The dyed fluoropolymer of claim 2 wherein said Z is a divalent alkylene containing 1 to about 15 carbon atoms, the alkylene optionally containing one or more catenary heteroatoms.

4. The dyed fluoropolymer of claim 3 wherein said Z is represented by $-C_nH_{2n}-$, wherein n is an integer of 1 to about 15.

5. The dyed fluoropolymer or claim 2 wherein said Q is represented by one of the following general formulas:

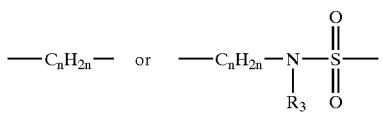

wherein n is an integer of 1 to about 4, and
$R_3$ is hydrogen or a straight chain or branched chain alkyl containing 1 to about 6 carbon atoms.

6. The dyed fluoropolymer of claim 2 wherein said $R_f$ has 3 or 4 carbon atoms.

7. The dyed fluoropolymer of claim 1 wherein said fluorochemical (meth)acrylate monomers are chosen from the group consisting of N-methyl perfluorobutanesulfonamidoethyl acrylate and N-methyl perfluorobutanesulfonamidoethyl acrylate.

8. The dyed fluoropolymer of claim 7 wherein at least 75 percent of the fluorochemical (meth)acrylate monomers are N-methyl perfluorobutanesulfonamidoethyl acrylate.

9. The dyed fluoropolymer of claim 1 further comprising (meth)acrylic acid.

10. The dyed fluoropolymer of claim 9 comprising less than 2 weight percent (meth)acrylic acid.

11. The dyed fluoropolymer of claim 9 comprising fluoroalkyl (meth)acrylate/(meth)acrylic acid copolymer, wherein said fluoroalkyl group has 12 or fewer carbon atoms.

12. The dyed fluoropolymer of claim 1 further comprising one or more hydrocarbon monomers.

13. The dyed fluoropolymer of claim 12 wherein said hydrocarbon monomers are chosen from the group consisting of butyl methacrylate and lauryl methacrylate.

14. The dyed fluoropolymer of claim 1 wherein said (meth)acrylate functional dye is fluorescent.

15. The dyed fluoropolymer of claim 14 wherein said (methacrylate functional dye is represented by the following general formula:

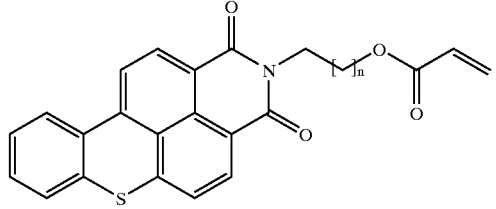

wherein n is an integer from 1 to about 15.

16. The dyed fluoropolymer of claim 15 wherein said n is 4.

17. The dyed fluoropolymer of claim 14 wherein said (meth)acrylate functional dye is represented by the following general formula:

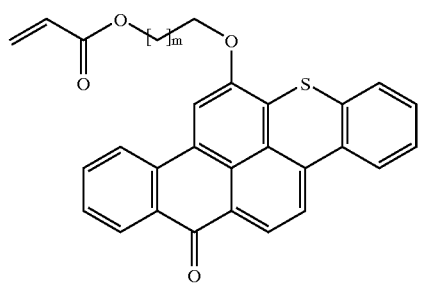

wherein m is an integer from 1 to about 15.

18. A coating composition comprising a dyed fluoropolymer comprising (a) the reaction product of (i) N-methyl perfluorobutanesulfonamidoethyl acrylate, (ii) N-methyl perfluorobutanesulfonamidoethyl methacrylate, (iii) methacrylic acid, (iv) butyl methacrylate, (v) lauryl methacrylate, and (vi)

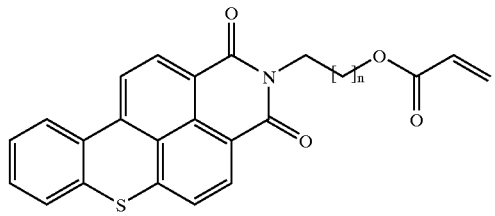

wherein n=4, and (b) a solvent comprising one or more hydrofluoroethers.

19. A coating composition comprising the dyed fluoropolymer of claim 1.

20. The coating composition of claim 19 further comprising a solvent.

21. The coating composition of claim 20 wherein said solvent comprises one or more hydrofluoroethers.

22. An article coated with the coating composition of claim 18.

23. The article of claim 22 wherein said article is a circuit board assembly.

* * * * *

UNITED STATES PATENT AND TRADEMARK OFFICE
CERTIFICATE OF CORRECTION

PATENT NO. : 6,894,105 B2
DATED : May 17, 2005
INVENTOR(S) : Parent, Michael J.

It is certified that error appears in the above-identified patent and that said Letters Patent is hereby corrected as shown below:

Column 3,
Lines 10-15, delete " 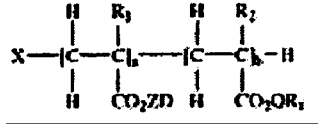 " and insert -- 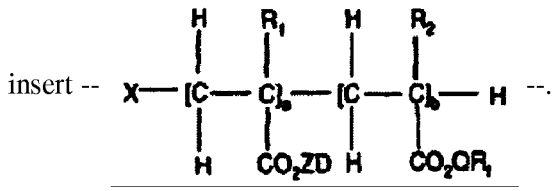 --.

Line 20, delete "z" and insert -- Z --.

Columns 11-12,
Column 2, Row 2 (Glossary Table), insert -- where n = 1 --.

Column 13,
Line 50, delete "D2.8" and insert -- D2  .8 --.
Line 51, delete "D3.8" and insert -- D3  .8 --.
Line 52, delete "D4.10" and insert -- D4 .8 --.

Column 22,
Line 25, after "20.6 g" delete ":" and insert -- ; --.

Column 29,
Line 2, after "following" insert -- general --.
Line 12, after "hydrogen" insert -- or --.
Line 30, delete "or" and insert -- of --.
Line 48, delete "acrylate" and insert -- methacrylate --.

UNITED STATES PATENT AND TRADEMARK OFFICE
CERTIFICATE OF CORRECTION

PATENT NO. : 6,894,105 B2
DATED : May 17, 2005
INVENTOR(S) : Parent, Michael J.

It is certified that error appears in the above-identified patent and that said Letters Patent is hereby corrected as shown below:

Column 30,
Line 2, after "(meth" insert -- ) --.

Signed and Sealed this

Twenty-seventh Day of December, 2005

JON W. DUDAS
*Director of the United States Patent and Trademark Office*